United States Patent [19]
Bulovic et al.

[11] Patent Number: 6,046,543
[45] Date of Patent: *Apr. 4, 2000

[54] HIGH RELIABILITY, HIGH EFFICIENCY, INTEGRATABLE ORGANIC LIGHT EMITTING DEVICES AND METHODS OF PRODUCING SAME

[75] Inventors: Vladimir Bulovic, Metuchen; Stephen R. Forrest, Princeton; Paul Burrows, Princeton; Dmitri Z. Garbuzov, Princeton, all of N.J.

[73] Assignee: The Trustees of Princeton University, Princeton, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/774,119

[22] Filed: Dec. 23, 1996

[51] Int. Cl.[7] .............................. H01J 1/62; H01J 63/04
[52] U.S. Cl. .......................................... 313/504
[58] Field of Search ................... 313/504, 506, 313/507, 509, 499; 428/421, 690, 691

[56] References Cited

U.S. PATENT DOCUMENTS

| | | | |
|---|---|---|---|
| 4,281,053 | 7/1981 | Tang | 430/58 |
| 4,356,429 | 10/1982 | Tang | 313/504 |
| 4,670,689 | 6/1987 | Suzuki | 313/499 |
| 4,908,603 | 3/1990 | Yamaue et al. | |
| 4,950,950 | 8/1990 | Perry et al. | |
| 5,084,650 | 1/1992 | Ryu | 313/507 |
| 5,118,986 | 6/1992 | Ohnuma et al. | 313/504 |
| 5,122,711 | 6/1992 | Wakimoto et al. | |
| 5,291,098 | 3/1994 | Okita et al. | |
| 5,294,870 | 3/1994 | Tang et al. | 313/504 |
| 5,352,543 | 10/1994 | Ryu | 313/507 |
| 5,427,858 | 6/1995 | Nakamura et al. | 428/421 |
| 5,449,564 | 9/1995 | Nishio et al. | 313/504 |
| 5,457,565 | 10/1995 | Namiki et al. | 359/273 |
| 5,486,406 | 1/1996 | Shi | 313/504 |
| 5,505,985 | 4/1996 | Nakamura et al. | |
| 5,529,853 | 6/1996 | Hamada et al. | |
| 5,540,999 | 7/1996 | Yamamoto et al. | 313/504 |
| 5,663,573 | 9/1997 | Epstein et al. | 257/40 |
| 5,674,597 | 10/1997 | Fuji et al. | 313/504 |
| 5,703,436 | 12/1997 | Forrest et al. | 313/506 |
| 5,707,745 | 1/1998 | Forrest et al. | 428/432 |
| 5,719,467 | 2/1998 | Antoniadis et al. | 313/506 |
| 5,757,139 | 5/1998 | Forrest et al. | 313/504 |
| 5,780,174 | 7/1998 | Tokito et al. | 313/506 |
| 5,821,690 | 10/1998 | Martens et al. | 313/506 |

FOREIGN PATENT DOCUMENTS

| | | |
|---|---|---|
| 0715 803 B1 | 10/1997 | European Pat. Off. . |
| WO 95/06400 | 3/1995 | WIPO . |

OTHER PUBLICATIONS

Garbuzov et al., "Photoluminescence efficiency and absorption of aluminum–tris–quinolate ($Alq_3$) thin films", Chemical Physics Letters 249 (1996) 433–437 (no month).

Baigent et al., "Conjugated polymer light–emitting diodes on silicon substrates", Appl. Phys. Lett. 65 (21), Nov. 21, 1994, 2636–2638.

Burrows et al., "Reliability and degradation of organic light emitting devices", Appl. Phys. Lett. 65 (23), Dec. 5, 1994, 2922–2924.

Garbuzov et al., "Organic films deposited on Si p–n junctions: Accurate measurements of fluorescence internal efficiency, and application to luminescent antireflection coatings", Journal of Applied Physics, vol. 80, No. 8, Oct. 15, 1996, 4644–4648.

Tang et al., "Organic Electroluminescent Diode," Appl. Phys. Lett. 51, 913(Sep. 1987).

*Primary Examiner*—William Oen
*Attorney, Agent, or Firm*—Kenyon & Kenyon

[57] ABSTRACT

An organic light emitting device (OLED) having an inverted structure including a cathode layer which is deposited on a substrate and on top of which an electron transporting layer (ETL), an electroluminescent (EL) layer, a hole transporting layer (HTL), a protection layer and an anode are deposited in sequence. The inverted OLED (IOLED) provides improved longevity, flexibility and efficiency over conventional OLEDs.

11 Claims, 8 Drawing Sheets

HIGH RELIABILITY, HIGH EFFICIENCY, INTEGRATABLE ORGANIC LIGHT EMITTING DEVICES AND METHODS OF PRODUCING SAME

GOVERNMENT RIGHTS

This invention was made with Government support under Contract No. F33615-94-1-1414 awarded by DARPA. The government has certain rights in this invention.

FIELD OF THE INVENTION

The present invention relates to the field of light emitting devices, in particular, to organic light emitting devices (OLEDs) and to methods of producing same.

BACKGROUND INFORMATION

OLEDs are light emitting devices which use organic electroluminescent (EL) materials excited by electric current to emit light. A conventional OLED structure is described in an article by C. W. Tang and S. A. VanSlyke, "Organic Electroluminescent Diode", *Applied Physics Letters*, Vol. 51, 913 (1987) ("Tang & VanSlyke 1987"). Tang and VanSlyke describe a device in which an indium tin oxide (ITO) anode is placed on a glass substrate and covered successively with a hole transport layer composed of an aromatic diamine, a luminescent layer composed of tris-(8-hydroxyquinoline) aluminum ($Alq_3$) and a metallic cathode composed of a magnesium/silver (Mg:Ag) alloy. EL light is emitted by the recombination of holes and electrons in the luminescent $Alq_3$ layer. In this structure, the EL light is emitted down through the hole transport and ITO layers and the glass substrate.

Conventional OLEDs, however, suffer from several drawbacks and limitations.

In order to use OLEDs in a display application, it is necessary to integrate the OLEDs with circuitry, such as active matrix display drivers, which will power and control the OLEDs. Such control and power circuitry can be based on different technologies, some of which deliver positive and others negative voltage to the OLED. For technology which delivers negative voltage to the OLED (such as amorphous Si NFETs), it is necessary to have the OLED cathode in contact with the circuit's driving element. The bottom terminal of a conventional OLED, however, is an anode. This limits the ability to integrate negative voltage technology control circuitry with conventional OLEDs.

Conventional OLEDs also have long-term reliability problems. Degradation mechanisms of OLEDs have been extensively investigated recently. It is commonly understood that the exposure of a conventional OLED to air while the device is in operation accelerates device degradation, as described in P. E. Burrows et al. "Reliability and Degradation of Organic Light Emitting Devices", *Applied Physics Letters*, Vol. 65, 2922 (1994). More specifically, degradation mechanisms involving the top metal electrode of conventional OLEDs have been observed.

Another problem experienced with conventional OLEDs is that a significant portion of the EL light generated in the OLED is not emitted in a direction normal to the device, but is rather waveguided in the substrate, which must be substantially transparent, or in the organic films. This problem is described in D. Z. Garbuzov et al., "Photoluminescence Efficiency and Absorption of Aluminum-tris-quinolate ($Alq_3$) Thin Films", *Chemical Physics Letters*, Vol. 249, 433 (1996). The waveguided light does not reach the observer standing in front of the OLED and is effectively lost, thereby reducing the effective efficiency of the OLED.

SUMMARY OF THE INVENTION

The present invention is directed to high reliability, high efficiency, integratable OLED structures which overcome many of the disadvantages of conventional OLEDs. An OLED in accordance with the present invention comprises a cathode layer; a first organic layer formed on the cathode layer; a second organic layer formed on the first organic layer; a protection layer formed on the second organic layer; and an anode formed on the protection layer, wherein at least one of the first and second organic layers emits a first light upon application of a voltage between the anode and the cathode layer.

In contrast to known OLEDs, the OLED of the present invention has an inverted structure (and as such will be alternatively referred to as an "inverted OLED" or IOLED) which provides the OLED of the present invention with several advantages over known OLED structures.

IOLEDs can be grown on any sufficiently flat substrate to which a magnesium/silver (Mg:Ag) alloy will adhere. The substrate can be opaque or transparent, flexible or rigid. Since light is emitted from the top side of the IOLED, the device can be grown on top of opaque substrates, in contrast to a conventional OLED which must be grown on a transparent substrate. IOLEDs can therefore be deposited directly on top of integrated circuits (such as a silicon-based array of transistors) which could provide power to and control OLED operation in a display application. For control circuit technology which delivers negative voltage to the OLED (such as amorphous silicon NFETs), it is necessary to have the OLED cathode in electrical contact with the circuit's driving element. Unlike a conventional OLED, the bottom terminal of the IOLED is a cathode which makes it possible to deposit the IOLED directly onto such a driving circuit.

Furthermore, because an IOLED in accordance with the present invention can be grown on any sufficiently flat substrate, the substrate can be thin. Such an inverted OLED on a thin substrate can be used in xerographic printing, thereby eliminating the need for lensing in printer bars.

The IOLED of the present invention also provides improved reliability over conventional OLEDs. In the IOLED of the present invention, the metal electrode is on the bottom of the device, protected from exposure to atmosphere by the overlying organic layers as well as by an ITO (Indium Tin Oxide) electrode arranged on the top of the IOLED. Because the ITO material is an oxide, the ITO electrode is not susceptible to appreciable atmospheric degradation.

Furthermore, the IOLED can be grown on top of atomically smooth substrates. This avoids device degradation due to roughness imperfections of ITO or embedded particles. In contrast, conventional OLEDs are grown on ITO coated substrates which invariably exhibit some roughness.

IOLEDs can also be stacked, with a second OLED grown on top of the first. Conventional transparent OLEDs can also be stacked on top of IOLEDs and vice versa, thereby increasing overall design flexibility.

The present invention also provides an OLED structure for improving emission efficiency. In accordance with the present invention, EL light that would otherwise be waveguided in the substrate or organic films of an OLED, and thus not emitted normal to the device toward the observer, can be redirected towards the observer by reflective side walls built into a patterned substrate on which the OLED is grown, thereby increasing the effective efficiency of the OLED.

The OLED of the present invention can be used in a wide variety of applications, including computer displays, informational displays in vehicles, television monitors, telephones, printers, illuminated signs, large-area screens and billboards.

DETAILED DESCRIPTION

Figure 1:
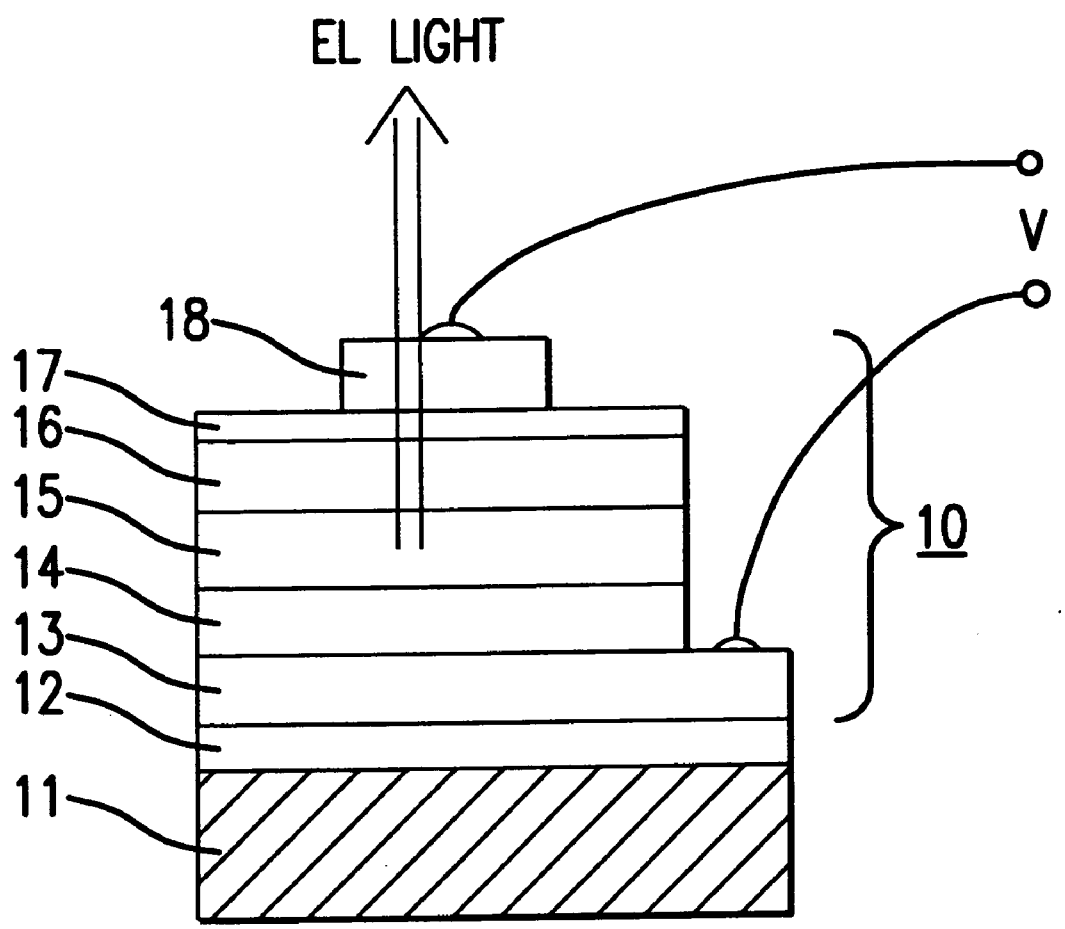
FIG. 1 shows an OLED structure in accordance with the present invention.

FIG. 1 shows the device structure of an inverted organic light emitting device (IOLED) 10 in accordance with the present invention. The IOLED 10 is grown on a substrate 11, which can be either opaque or transparent, flexible or rigid. As such, the substrate can be composed of a wide variety of materials, such as polystyrene or aluminum foil. Any roughness present on the surface of the substrate 11 can be smoothed by depositing an optional thin layer of polymer 12 on top of the substrate, or by applying a similar smoothing technique. The IOLED 10 is deposited on top of the smoothed substrate.

The IOLED structure comprises a cathode 13 on top of which an electron transporting layer (ETL) 14, an electroluminescent (EL) layer 15, a hole transporting layer (HTL) 16, a protection layer 17, and an anode 18 are deposited in sequence.

The cathode 13 injects electrons into the ETL 14, while the anode 18 injects holes into the protection layer 17 which in turn injects the holes into the HTL 16. The ETL and HTL conduct electrons and holes, respectively, into the EL layer, where the two kinds of carriers recombine, generating EL light.

In a further embodiment of the IOLED of the present invention, a single organic layer can perform the functions of both the ETL 14 and EL layer 15. In the alternative, a single organic layer can act as both the HTL 16 and EL layer 15.

The protection layer 17 protects the underlying soft organic layers against damage caused by the deposition of the ITO anode 18. The protection layer 17 should have a sufficiently high hole conductivity to allow sufficient injection of holes into the HTL 16 for the device to operate. The protection layer 17 can be formed by the deposition of 3,4,9,10-perylenetetracarboxilic dianhydride (PTCDA), bis (1,2,5-thiadiazolo)-p-quinobis(1,3-dithiole) (BTQBT), copper phthalocyanine (CuPc), or other suitable, more rigid organic materials. The protection layer 17 does not significantly contribute to absorption of the emitted EL light, as it is very thin (approx. 50–500 Å) and possibly transparent to EL emissions. Also, only a small fraction of the total voltage is dropped through the protection layer 17 because it is conductive and very thin compared to the rest of the device.

Moreover, with the IOLED structure of the present invention, the ETL 14 is not damaged by the deposition of the metallic cathode 13 because the ETL is deposited on top of the cathode. This is in contrast to a conventional OLED structure in which the cathode is deposited on the ETL.

In an exemplary embodiment of the IOLED of the present invention, the substrate 11 was formed from polished (100) Si. Prior to deposition of the IOLED, the substrate was cleaned by sequential ultrasonic rinses in detergent solution and deionized water, followed by a boil in 1,1,1-trichloroethane, a rinse in acetone and a boil in 2-propanol. Between each cleaning step, the substrate was dried in pure nitrogen gas. In this embodiment, the smoothing layer 12 was omitted as the surface of the polished (100) Si was sufficiently smooth. The cathode 13 was formed as a 2000 Å layer of Mg:Ag alloy (in a mass ratio of 5:1). The cathode 13 can typically be 500 to 2000 Å thick. The ETL 14 and the EL layer 15 were formed as one 650 Å layer of $Alq_3$ and the HTL 16 was formed as a 300 Å layer of N,N'-diphenyl-N, N'-bis(3-methylphenyl)1-1'biphenyl-4,4'diamine (TPD) or 4,4'-bis[N-(1-napthyl)-N-phenyl-amino]biphenyl ($\alpha$-NPD). The protection layer 17 was formed as a 120 Å layer of PTCDA, and the anode 16 was formed with a 950 Å layer of ITO. The protection layer can typically be 20 to 170 Å thick.

The Mg:Ag, $Alq_3$, TPD, and PTCDA layers were deposited by thermal evaporation from resistively heated molybdenum boats at an ambient pressure of $1 \times 10^{-6}$ Torr. (The pressure rose to $1 \times 10^{-5}$ Torr during Mg:Ag deposition.) The typical deposition rate ranged from 1 to 5 Å/second. The ITO layer was deposited by RF sputtering of a pressed ITO target in the ambient atmosphere composed of argon and oxygen (in a volume ratio of 2000:1), and 5 mTorr pressure. The RF power was 5W, which resulted in a deposition rate of 200 Å/hour.

Instead of $Alq_3$, the EL layer can also be formed using emissive compounds disclosed in co-pending U.S. Provisional Patent Application No. 072,095, filed on Dec. 23, 1996 titled NOVEL MATERIALS FOR MULTICOLOR LED's, (Attorney Docket No. 10020/2) and U.S. patent application Ser. No. 08/774,087, filed on Dec. 23, 1996, titled RED OLED's, (Attorney Docket No. 10020/5), filed on even date herewith and incorporated herein by reference in their entirety. The emissive compounds disclosed therein can be selected to emit light of a desired range of wavelengths.

The ETL can also be formed using a compound such as that disclosed in co-pending U.S. patent application Ser. No. 08/774,120, filed Dec. 23, 1996 titled ELECTRON TRANSPORTING AND LIGHT EMITTING LAYERS BASED ON ORGANIC FREE RADICALS, filed on even date herewith and incorporated herein by reference in its entirety (Attorney docket no. 10020/3). The compound disclosed therein is comprised of a stable chemical radical.

OLEDs fabricated in accordance with the present invention have been demonstrated to have a superior lifetime in air compared to conventional OLEDs (e.g., such as that described in Tang and VanSlyke 1987).

Figure 2:
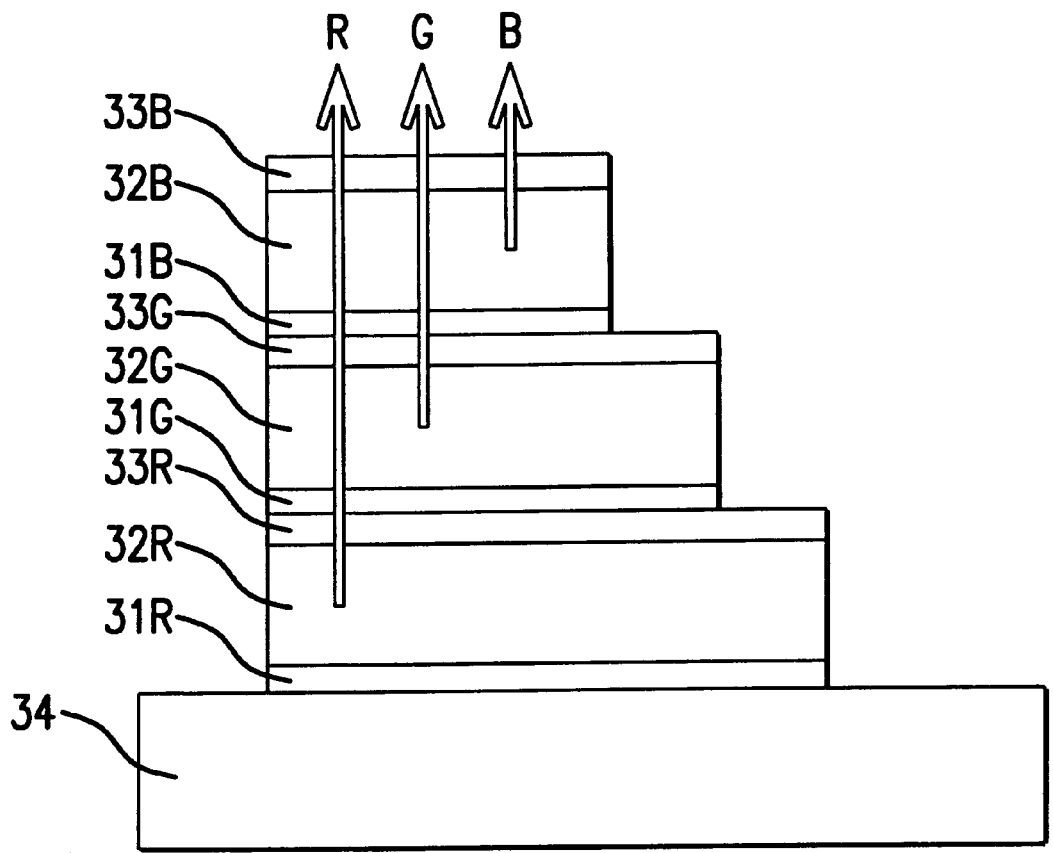
FIG. 2 shows a stacked OLED structure in accordance with the present invention.

IOLEDs in accordance with the present invention can also be stacked, with multiple OLEDs grown on top of each other. FIG. 2 shows a structure with three stacked IOLEDs that emit red, green and blue light, respectively, to form a true color pixel. Each of the three OLEDs can be independently controlled. Layers 31R, 31G and 31B are cathode layers and 33R, 33G and 33B are the anode layers for the red, green and blue IOLEDs, respectively. The ETL, EL layer, HTL and protection layer are illustrated as single blocks 32R, 32G and 32B for the red, green, and blue IOLEDs, respectively. Note that cathode layers 31G and 31B should be very thin (less than 200 Å) in order to be transparent. The stacked structure is grown on top of a substrate 34.

In the stacked structure of FIG. 2, the anodes 33R, 33G and 33B of the OLEDs in the stack are each deposited on top of a protection layer. The three protection layers are of identical composition. In order to emit the three different colors, however, the three organic ETL/EL layers beneath the protection layers are of different composition. In a conventional stacked OLED structure which does not include protection layers, a cathode would be deposited over each ETL/EL layer directly, with each ETL/EL layer being different from the other ETL/EL layers. In the stacked structure of the present invention, however, an anode is deposited over each protection layer, each protection layer being the same as the other protection layers. This allows for a greater chance of growing a working structure, thereby improving manufacturing yields.

A conventional transparent OLED can be stacked on top of an IOLED and vice versa, thereby increasing overall design flexibility.

The present invention also provides an OLED structure with superior efficiency, compared to conventional structures, in coupling EL light out of the OLED. With conventional OLEDs, a significant fraction of the EL light generated in the OLED is not emitted in the direction normal to the device, but is rather waveguided in the substrate or the organic films. The waveguided light does not reach the observer standing in front of the OLED and is effectively lost. In accordance with the present invention, an OLED is grown on a patterned substrate that is structured to redirect the waveguided light towards the observer, thereby increasing the effective efficiency of the OLED. This structure can also be adapted for use with conventional OLEDs.

Figure 3A:
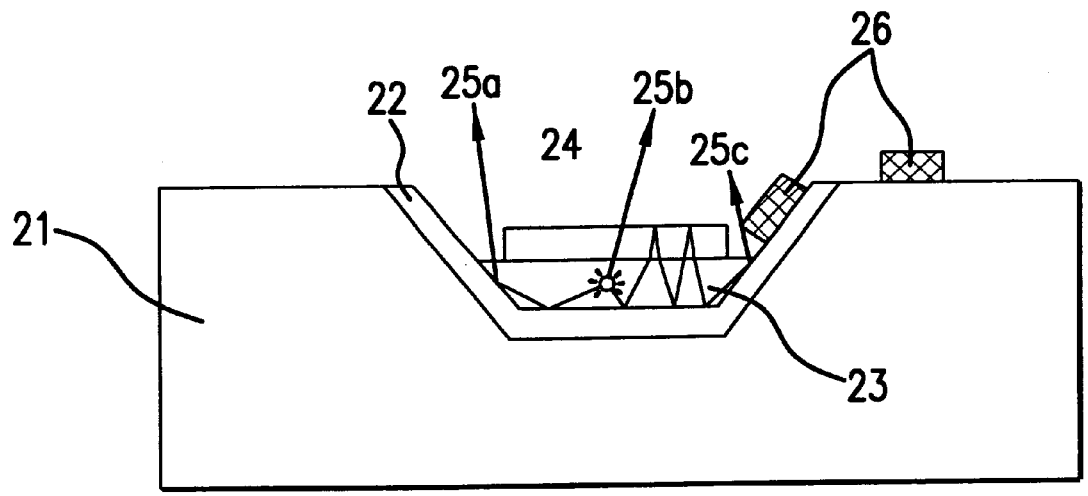
FIGS. 3A through 3G show structures for improving the efficiency of OLEDs in accordance with the present invention.

FIG. 3A shows a device structure utilizing an IOLED fabricated on a patterned substrate 21 which redirects waveguided light 25c in a direction substantially normal to the substrate. The IOLED comprises a cathode 22, organic layers 23 (shown for simplicity as one layer) and an anode 24. In the exemplary structure of FIG. 3A, the IOLED is grown in a patterned substrate having a pit with a flat bottom surface and 45° slanted side walls (i.e., each side wall forms an angle of substantially 135° with the bottom surface of the pit). The OLED cathode 22 is first deposited over the pit area, including the slanted walls. The OLED cathode, which is metallic, also acts as a mirror to reflect light emitted by the OLED. After deposition of the cathode, the organic layers 23 and the ITO anode 24 are then deposited.

Light generated in the organic layers can be either transmitted through the top anode 24, e.g. light ray 25b, reflected from one of the mirrored walls, e.g. light ray 25a, or waveguided in the organic layers 23 and/or the top ITO electrode 24 and then reflected from one of the mirrored walls, e.g. light ray 25c.

The depth of the pit in which the reflective OLED structure is formed can be relatively shallow, on the order of 1000–3000 Å, and as wide as desired.

Interconnects 26 for connecting the OLED to control circuitry or to other OLEDs, as in a matrix arrangement, are shown in FIG. 3A. One of the interconnects 26 is coupled to the anode and the other interconnect is coupled to the cathode of the OLED shown.

Figure 3B:
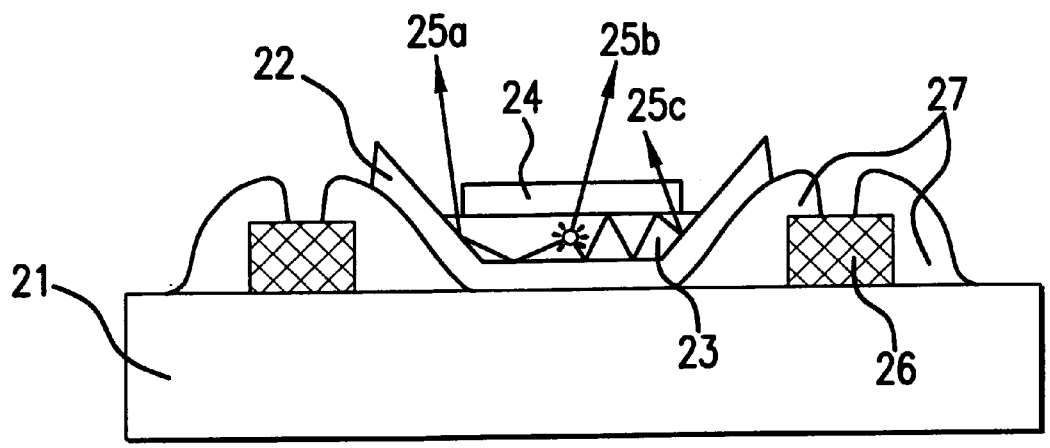

A reflective structure similar to that of FIG. 3A can also be formed in a planarized structure as shown in FIG. 3B. In this structure, the OLED cathode 22 is deposited over a polyimide layer 27 that partially covers the interconnects 26. The cathode 22 conforms to the shape of the polyimide 27 which is readily shapable or moldable so as to impart to the cathode the desired slope and shape.

An advantage of the OLED structure of the present invention is that it can be built compactly and is independent of substrate transparency or composition. As such, the OLED of the present invention can also be grown on a reflective metal foil.

If the structure is grown in a pitted substrate (as in FIG. 3A) the interconnect lines 26 can be placed on the side walls and on the substrate. If the structure is grown over a planar substrate (as in FIG. 3B) the interconnect lines can be placed on the substrate.

Figure 3C:
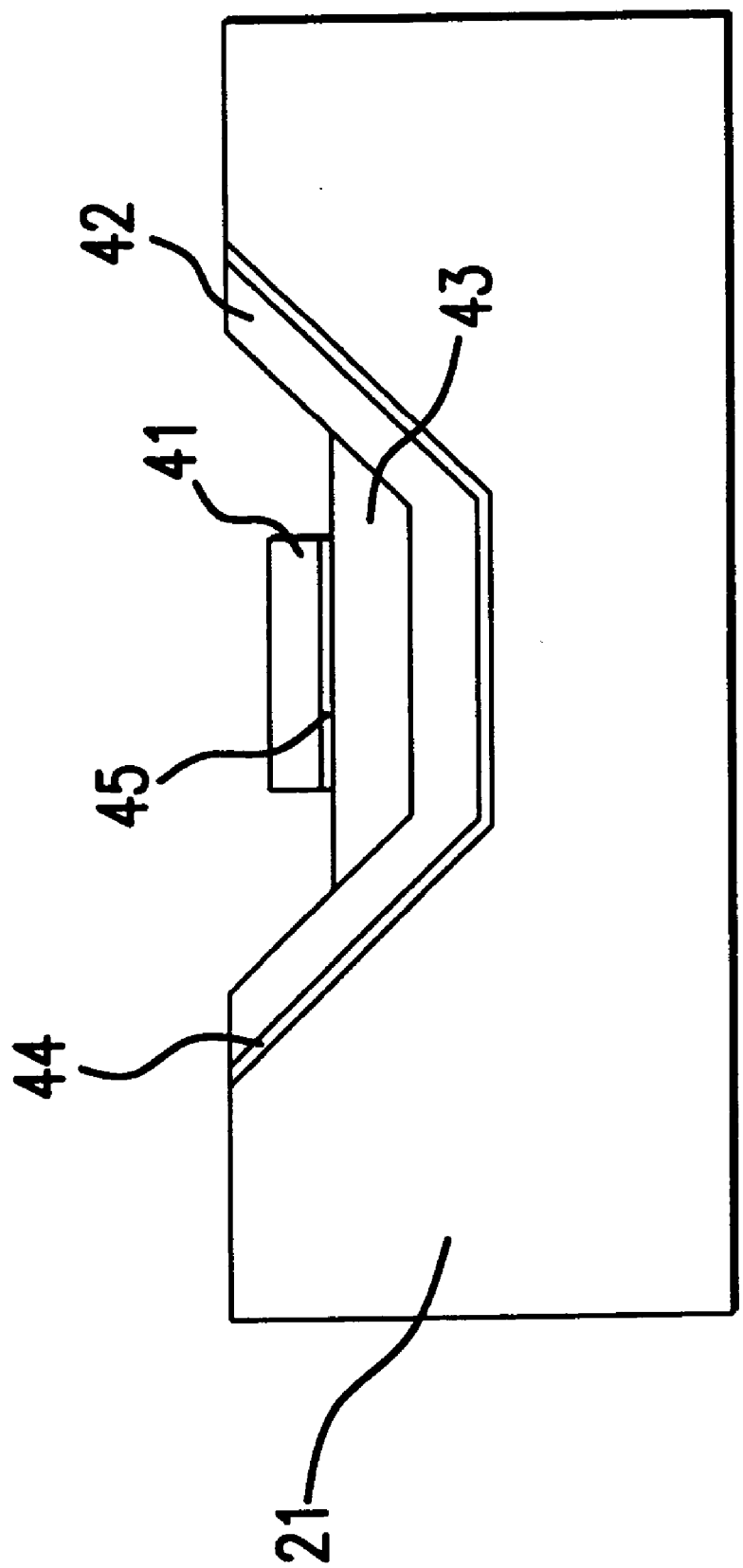

The arrangements of FIGS. 3A and 3B can also be adapted to non-inverted OLEDs. FIG. 3C shows a structure similar to that of FIG. 3A adapted for use with a substantially transparent OLED (TOLED). TOLEDs are described in U.S. patent application Ser. No. 08/613,207 incorporated herein by reference in its entirety. As described above, the substrate 21 is provided with a pit having 45-degree slanted walls. A metallic layer 44 is first deposited over the pit area, including the slanted walls. The metallic layer 44 is typically composed of aluminum (Al) or gold (Au) and serves as a reflective surface. An anode layer 42 composed of ITO is then deposited over the metallic layer 44 and organic layers 43 are then deposited over the ITO anode 42. A thin (e.g. less than 100 Å thick), substantially transparent metallic layer 45 composed of an Mg:Ag layer is then deposited on the organic layer 43 and is then covered with a cathode 41 composed of ITO.

Figure 3D:
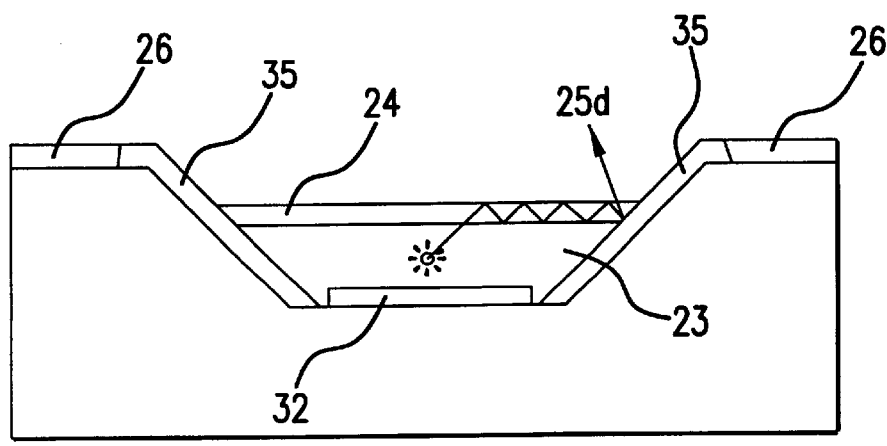
Figure 3E:
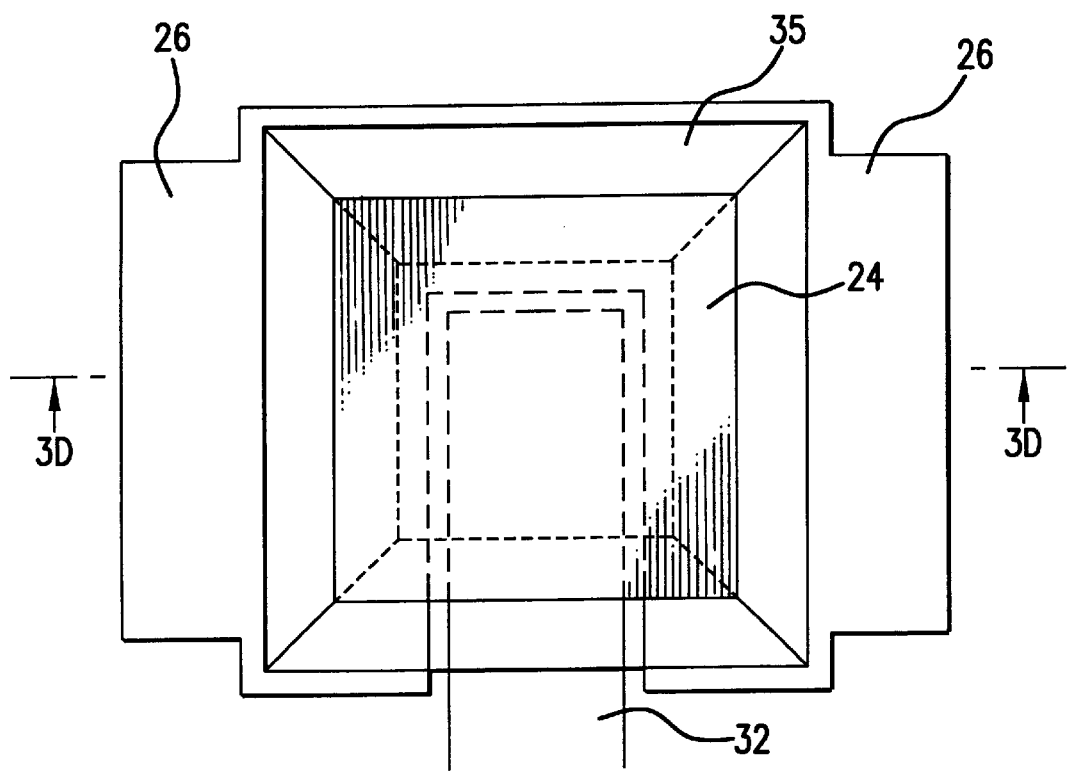

FIGS. 3D and 3E are cross-section and plan views, respectively, of a further embodiment of the present invention. Some of the light emitted in the organic layers 23 is also trapped by waveguiding in the ITO anode layer 24. This is illustrated in FIG. 3D by the light ray 25d. To redirect the light that is waveguided in the ITO layer 24, it is desirable to extend the ITO layer 24 to the reflective, slanted side walls, as shown in FIG. 3D. As described above, the side walls are made reflective by the deposition of a metallic layer, in this case, layer 35. Because in this embodiment the ITO anode 24 is in contact with the metallic layer 35, the metallic cathode 32 must be electrically isolated from the metallic layer 35, as shown in FIGS. 3D and 3E.

In the embodiment of FIGS. 3D and 3E, a metallic layer is deposited over the entire pit area and then etched into two regions, thereby forming the cathode 32 and the reflective metallic layer 35. The organic layers 23 are then deposited into the pit and covered with a layer of ITO which forms the anode 24. The anode 24 is in electrical contact with the metallic layer 35. As such, the metallic layer 35 can be integral with the interconnects 26. As shown in FIG. 3E, the layer 35 provides a direct metallic path from one side of the OLED to the other, thus allowing multiple, similarly fabricated OLEDs to be interconnected in a row and thereby facilitating the interconnection of multiple OLEDs in a regular arrangement, such as in a matrix.

Figure 3F:
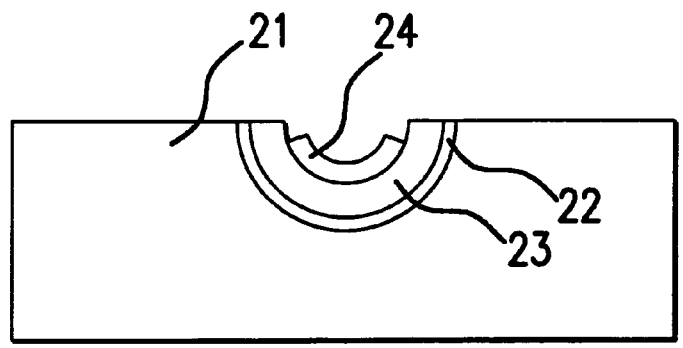

In addition to the pit structures shown so far, which have straight, slanted reflective side walls, other cross-sections are also possible. FIG. 3F shows another exemplary embodiment in which a pit with a semicircular cross-section, e.g., a hemispherical pit, is used.

Figure 3G:
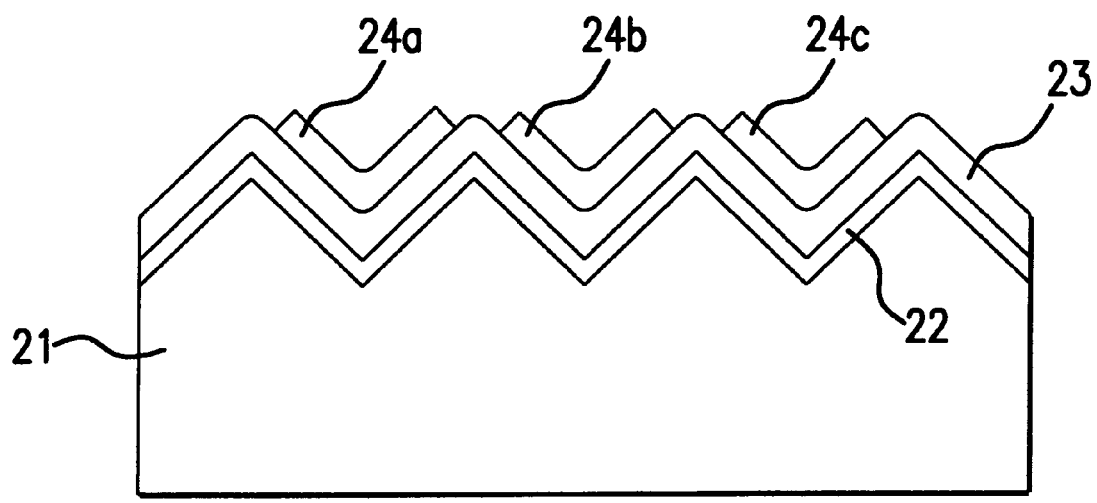

In yet a further exemplary embodiment, a reflective structure can be fabricated over a substrate 21 with a sawtooth patterned top surface, as shown in FIG. 3G. In the exemplary embodiment of FIG. 3G, three IOLEDs are formed with an individual ITO anode 24a, 24b, 24c for each IOLED and a common cathode 22 and common organic layers 23.

An arrangement for interconnecting the inverted reflective OLED structure of FIG. 3A will now be described with reference to FIGS. 4A through 4C and 4X through 4Z. This arrangement is well suited, for example, for interconnecting a plurality of OLEDs in a matrix in which each OLED is coupled to a row and a column of interconnects 26.

Figure 4A:
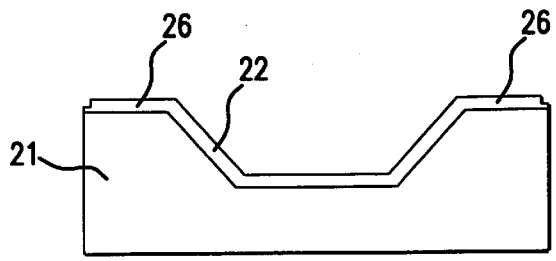
FIGS. 4A through 4C and 4X through 4Z are cross-section and plan views respectively, of an OLED structure with interconnect undergoing successive fabrication steps.
Figure 4X:
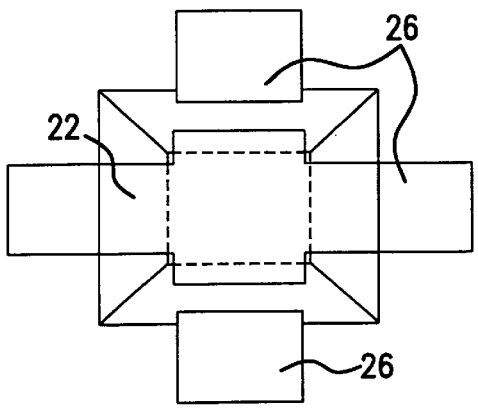
Figure 4B:
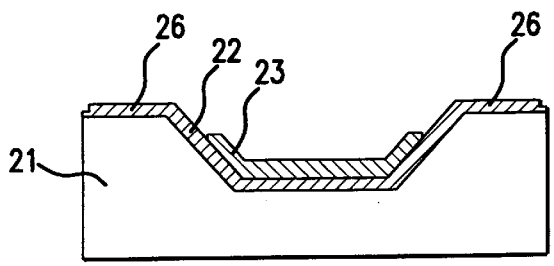
Figure 4Y:
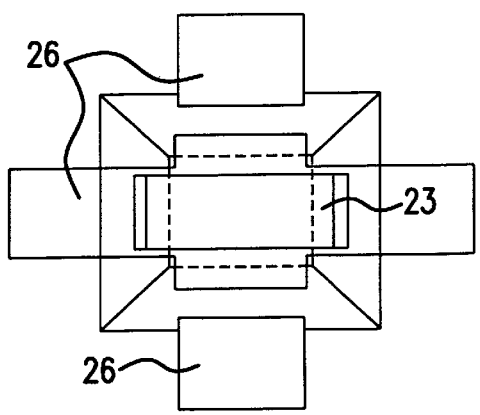
Figure 4C:
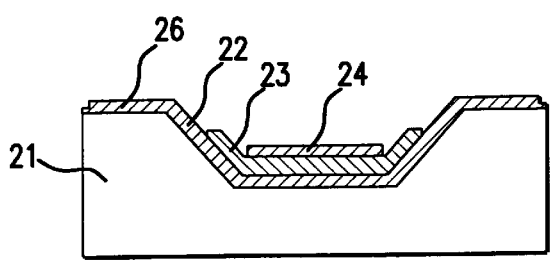
Figure 4Z:
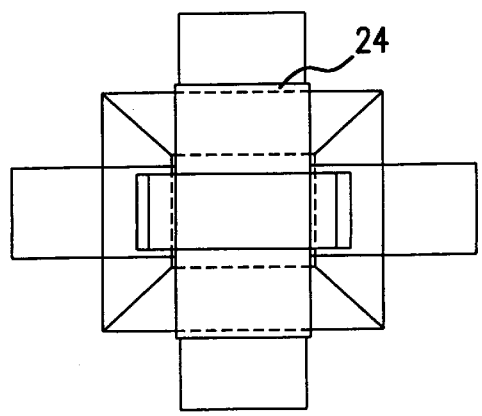

FIGS. 4A through 4C are cross-sectional views of an OLED undergoing successive processing steps, and FIGS. 4X through 4Z are corresponding plan views.

As shown in FIGS. 4A and 4X, the metallic cathode 22 and interconnects 26 are deposited first onto the pit-structured substrate 21. The cathode 22 is in contact with a row-oriented interconnect 26. The organic layer 23 is then deposited over the cathode 22, as shown in FIGS. 4B and 4Y. The organic layer 23 includes the protection layer, ETL, EL layer and HTL. The ITO anode 24 is then deposited over the organic layer 23 as shown in FIGS. 4C and 4Z. As shown in FIG. 4Z, the ITO anode 24 is coupled to the interconnect segments 26 which are arranged in a column and also acts as a bridge between the two interconnect segments.

In order to extract even more EL light in the direction normal to the OLED, an antireflection (AR) coating can be deposited on the transparent ITO anode. For a conventional OLED, this entails depositing the AR coating on top of the transparent substrate prior to the deposition of the ITO layer and the rest of the OLED layers. In such a configuration, care must be taken to account for the reflections in the transparent substrate. For an IOLED, the EL light does not travel through the substrate, simplifying the AR coating design. Also, with the IOLED, the AR coating can be deposited directly on the anode and thus can at the same time serve as a passivating layer for protecting the IOLED from atmosphere-related degradation.

Furthermore, in the IOLED structure of the present invention, the organic layers are deposited on top of the metallic cathode layer, as opposed to conventional OLEDs in which the cathode is deposited on the organic layer. As such, the organic layers of the IOLED are not damaged, as are the organic layers of a conventional OLED, by the deposition of the cathode layer. As a result, materials such as Alq$_3$ in the organic layers of the IOLED of the present invention can be expected to exhibit a better EL quantum efficiency than in a conventional OLED structure.

Figure 5:
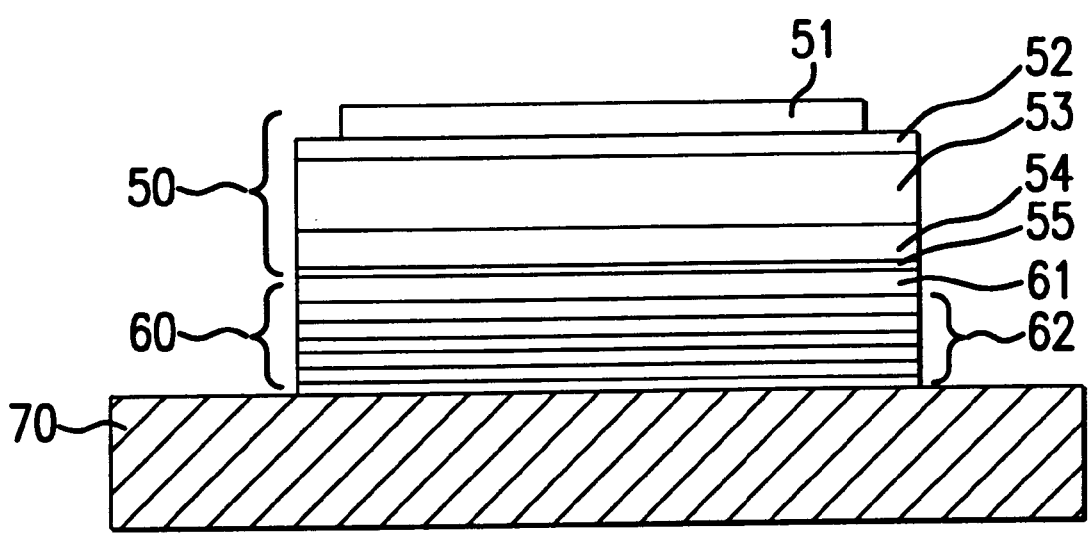
FIG. 5 shows an OLED in accordance with the present invention including a distributed Bragg reflector structure.

The IOLED structure of the present invention can also be fabricated with one or more filter structures for controlling the spectral width of the light emitted. FIG. 5 shows an IOLED 50 fabricated over a distributed Bragg reflector (DBR) structure 60 which is fabricated on a substrate 70. The DBR structure 60 is formed as a ¼-wavelength stack 62 of highly reflective layers of dielectric material. The stack 62 can be formed with two to ten alternating layers of titanium oxide TiO$_2$ and silicon oxide SiO$_2$. A layer 61 of ITO is deposited on the stack 62. The cathode 55 of the OLED 50, which is formed as a thin, semi-transparent layer of Mg:Ag alloy, is deposited on the ITO layer 61. The ETL/EL layer 54, HTL 53, protection layer 52 and ITO anode 51 are then deposited in sequence.

The combination of the ITO anode 51 and the bottom DBR structure 60 can provide good cavity and microcavity effect. In particular, if the thickness of the ETL/EL layer 54 is substantially equal to $\lambda/2n$, where $\lambda$ is the wavelength of the emitted light and n is the refractive index of the ITO anode layer 51 (which is approximately 2.0, relative to air), spectral narrowing is achieved with a considerable increase in the effective efficiency of the OLED.

To narrow the spectrum of the light emitted by the OLED of FIG. 5 even further, another DBR structure can be placed on top of the OLED 50. This, however, requires that electrical access to the anode 51 of the OLED be provided from a side of the combined structure. As an alternative, such a top-side DBR can be replaced by a color filter layer consisting of, for example, an organic dye film.

The subject invention as disclosed herein may be used in conjunction with the subject matter of co-pending applications, "Novel Materials for Multicolor LED's,"; "Electron Transporting and Light Emitting Layers Based on Organic Free Radicals,"; "Multicolor Display Devices,"; and "Red-Emitting Organic Light Emitting Devices (LED's),", each of said copending application being filed on the same date as the instant application, and being herein incorporated in its entirety by reference. The subject invention may also be used in conjunction with the subject matter of each of co-pending U.S. patent applications Ser. Nos. 08/354,674, 08/613,207, 08/632,316, 08/632,322 and 08/693,359 and U.S. Provisional Patent Applications Ser. Nos. 60/010,013 and 60/024,001, each of which is also herein incorporated in its entirety by reference.

What is claimed is:

1. An organic light emitting device comprising:

a substrate;

a cathode layer formed on a top surface of the substrate;

a first organic layer formed on the cathode layer;

a second organic layer formed on the first organic layer;

a protection layer formed on the second organic layer; and an anode layer formed on the protection layer, wherein at least one of the first and second organic layers emits a first light upon application of a voltage between the anode layer and the cathode layer.

2. The light emitting device of claim 1, wherein:

the first organic layer is comprised of an electroluminescent sublayer and an electron supporting sublayer, the second organic layer is a hole transporting layer, and the first organic layer emits the first light upon application of the voltage between the anode layer and the cathode layer.

3. The light emitting device of claim 1, wherein:

the first organic layer is an electron transporting layer, the second organic layer is an electroluminescent sublayer and a hole transporting sublayer, and the second organic layer emits the first light upon application of the voltage between the anode layer and the cathode layer.

4. The light emitting device of claim 1, wherein:

the first organic layer is comprised of an electroluminescent sublayer and an electron transporting sublayer, the electroluminescent sublayer being arranged between the electron transporting sublayer and the second organic layer, the second organic layer is a hole transporting layer, and the electroluminescent sublayer emits the first light upon application of the voltage between the anode layer and the cathode layer.

5. The light emitting device of claim 1, further including a smoothing layer between the top surface of the substrate and the cathode layer.

6. The light emitting device of claim 1, further comprising:

a second cathode layer formed over the anode layer;

a third organic layer formed on the second cathode layer;

a fourth organic layer formed on the third organic layer;

a second protection layer formed on the fourth organic layer; and a second anode layer formed on the second protection layer, wherein at least one of the third and fourth organic layers emits a second light upon application of a voltage between the second anode layer and the second cathode layer.

7. The light emitting device of claim 6, further comprising:

a third cathode layer formed over the second anode layer;

a fifth organic layer formed on the third cathode layer;

a sixth organic layer formed on the fifth organic layer;

a third protection layer formed on the sixth organic layer; and a third anode layer formed on the third protection layer, wherein at least one of the fifth and sixth organic layers emits a third light upon application of a voltage between the second anode layer and the second cathode layer.

8. The light emitting device of claim 7, wherein the first, second and third lights are selected from the group consisting of red, green and blue light.

9. The light emitting device of claim 1, further comprising a filter structure including two layers of dielectric material.

10. The light emitting device of claim 9, wherein the light emitting device is arranged over the filter structure.

11. A display including a plurality of light emitting devices in accordance with claim 1.

* * * * *